(12) United States Patent
Shintate

(10) Patent No.: US 7,805,836 B2
(45) Date of Patent: Oct. 5, 2010

(54) MANUFACTURING METHOD OF ELECTRONIC BOARD AND MULTILAYER WIRING BOARD

(75) Inventor: Tsuyoshi Shintate, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 433 days.

(21) Appl. No.: 11/939,644

(22) Filed: Nov. 14, 2007

(65) Prior Publication Data

US 2008/0119067 A1    May 22, 2008

(30) Foreign Application Priority Data

Nov. 16, 2006   (JP) .............. 2006-309942

(51) Int. Cl.
  *H05K 3/02*   (2006.01)
  *H05K 3/10*   (2006.01)
(52) U.S. Cl. .............. 29/846; 29/825; 29/829; 29/848; 427/97.1; 427/256
(58) Field of Classification Search .................. 29/846, 29/825, 829, 830, 848; 257/72, E21.174, 257/E21.538, E21.589; 427/97.1, 256, 553
See application file for complete search history.

(56) References Cited

U.S. PATENT DOCUMENTS 7,192,859 B2 * 3/2007 Yamazaki et al. ........... 438/597

2006/0045962 A1 * 3/2006 Miura ....................... 427/96.1

FOREIGN PATENT DOCUMENTS

| JP | 2005-251910 | 9/2005 |
|---|---|---|
| JP | 2005-327985 | 11/2005 |
| JP | 2006-066494 | 3/2006 |
| JP | 2006-287008 | 10/2006 |

* cited by examiner

*Primary Examiner*—Thiem Phan
(74) *Attorney, Agent, or Firm*—Workman Nydegger

(57) ABSTRACT

A manufacturing method of an electronic board includes: placing an electronic component including conductive parts on a first insulation layer with the conductive parts facing up as well as providing projections having conductivities on the conductive parts; applying an insulation material by means of a droplet discharging method providing a second insulation layer on an upper surface of the electronic component while dodging the projections, the second insulation layer having a height the projections project out from the layer; providing conductive wirings to be connected to the projections on the second layer; and applying the insulation material around the electronic component by means of the droplet discharging method to provide a third insulation layer having a height generally equal to the second insulation layer.

7 Claims, 5 Drawing Sheets

MANUFACTURING METHOD OF ELECTRONIC BOARD AND MULTILAYER WIRING BOARD

BACKGROUND

1. Technical Field

The invention relates to manufacturing methods of an electronic board and a multilayer wiring board.

2. Related Art

Recently, down sizing of electronic components to be mounted on a circuit board (wiring board) has been advanced and thus a minute wiring board is required. As for a method of forming the above stated minute wiring structure, there is such a technique that a conductive pattern is embedded in an insulation film using a droplet discharging method (see JP-A-2005-327985 which is an example of related art).

Down sizing has also been advanced recently with regard to electronic devices such as a cellular telephone, which includes the above described circuit board. A cellular telephone has only a limited space for receiving electronic components provided on a circuit board (wiring board). Therefore, such a method is required that the electronic components can be packed in high density.

In view of the above described circumstances, such a wiring board is considered that chip parts are packed in high density by employing a process that the chip parts are secured onto a substrate to apply an insulation material around the chip parts using the droplet discharging method, followed by embedding the chip parts in the insulation film and forming wirings to be connected to the chip parts.

The above described conventional technique, however, has problems as follows.

An ink having an insulation property may flow over conductive parts provided on upper surfaces of electronic components when the insulation material is disposed around the electronic components by means of the droplet discharging method when the electronic components are embedded in the insulation film. The insulation film formed of the ink having the insulation property, the ink having been cured under the above stated condition, covers the conductive parts of the electronic components, such that there arises a problem that no conduction can be established between wirings formed on the insulation film and the electronic components, resulting in causing a poor connection therebetween.

If side surfaces of an IC chip has, for example, a water-repellant property against the ink having the insulation property, the ink having the insulation property would not closely fit the side surfaces of the chip, such that there may be a case a space is produced between an insulation layer and the side surfaces of the chip. In this case, if the conductive wirings to be connected to an IC pads are formed over an insulation film having been provided around the IC pads, there may be a possibility of disconnection of the conductive wirings, resulting in also causing a poor connection.

SUMMARY

An advantage of the invention is to provide manufacturing methods of an electronic board and a multilayer wiring board which enable a good conduction between the wirings and the electronic components even in the case where the insulation film is formed around the electronic components by means of the droplet discharging method.

A manufacturing method of the electronic board according to an aspect of the invention includes: disposing an electronic component including conductive parts on a first insulation layer with the conductive parts facing up as well as for providing projections having conductivities on the conductive parts; applying, while dodging the projections, an insulation material by means of a droplet discharging method to thereby providing a second insulation layer in such a manner that the projections project out of a surface of the electronic component; providing on the second insulation layer conductive wirings to be connected to the projections; and applying the insulation material around the electronic component by means of the droplet discharging method to provide a third insulation layer so as to have a height generally equal to the second insulation layer.

In the aspect of the invention, the conductive wirings are formed on the second insulation layer provided on an upper surface of the electronic component without straddling the insulation layer disposed on around the electronic component. Therefore, the electronic component can be stably connected to the conductive parts through the projections without causing a disconnection of the conductive wirings even if there is produced a space between the insulation layer around the electronic component and the side surfaces of the electronic component.

The insulation material may be applied while dodging the projections when the second insulation layer is formed. Then, it is possible to avoid such a problem that the conductive wirings fail to have conduction with the projections and thus have a poor connection therebetween resulted from the insulation material. Therefore, the conduction can be stably secured. Further, a high density packaging can be realized by embedding the electronic component in the second and the third insulation layers.

In the aspect of the invention, a droplet discharging method may also be applied suitably to a process of forming the conductive projections.

Consequently, in the aspect, the conductive projections can be formed by means of the droplet discharging method without a necessity to perform a photolithography process or the like processes. This process can simplify processes required in manufacturing the electronic board.

In the aspect of the invention, a process for forming second projections having conductivities may be provided at positions away from the above described projections of the conductive wirings.

In view of the above, the conductive wirings of the invention serve as relocation wirings. The second projections to be electrically connected to the conductive parts of the electronic components can be positioned at anywhere thereby.

With the above stated structure, such a process that the conductive wirings and the second projections are formed by means of the droplet discharging method can be employed suitably.

Accordingly, the conductive wirings and the second projections can be formed by the droplet discharging method according to the invention without a necessity to perform the photolithography process or the like processes. The manufacturing process of the electronic board can be simplified thereby.

The invention may be also applicable to such a structure that the side surfaces of the electronic component have water-repellant properties against the insulation material.

Therefore, in the invention, even in the case where there is a difficulty in establishing a close fitting between the third insulation layer and the side surfaces of the electronic component due to the water-repellant properties of the side surfaces of the electronic component against the insulation material, the conductive wirings and the projections (conductive parts) can be stably connected to each other.

According to another aspect of the invention, a method of manufacturing a multilayer wiring board includes: applying the insulation material onto the conductive wirings, which are manufactured by means of the above described manufacturing method of the electronic board, by means of the droplet discharging method to form a fourth insulation layer; and forming on the fourth insulation layer a second conductive wiring to be electrically connected to the conductive parts.

According to this aspect of the manufacturing method of the multilayer wiring board of the invention, electronic boards, which can establish good conductions between the electronic component having been embedded in the insulation layer and the conductive wirings formed on the insulation layer, are layered one another. Then, it is possible to provide a highly reliable multilayer wiring board in which electronic components are packed in high density.

In the above described structure, the droplet discharging method can be applied suitably to a process for forming the second conductive wiring.

Accordingly, the second conductive wiring can be formed by means of the droplet discharging method without a necessity to perform the photolithography process or the like processes, such that the manufacturing process of the multilayer wiring board can be simplified.

DESCRIPTION OF EXEMPLARY EMBODIMENTS

Embodiments of manufacturing methods of an electronic board and a multilayer wiring board according to the invention will be described below with reference to FIGS. 1 to 5.

In each of the drawings to be employed for the sake of an explanation of the following description, a scale size of each of the components is modified as required in order for the each component to be recognizable.

Droplet Discharging Device

Initially, a droplet discharging device used in the manufacturing methods of the electronic board and the multilayer wiring board according to the invention will be explained below with reference to FIGS. 1 and 2.

Figure 1:
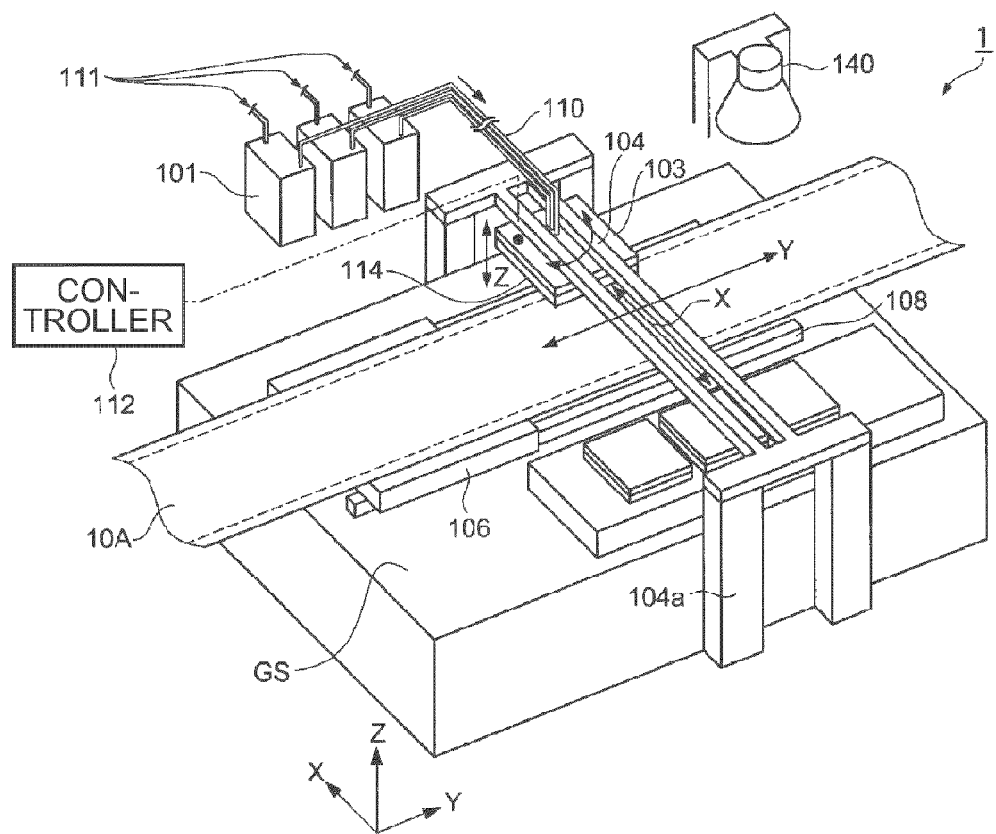
FIG. 1 is a schematic diagram of a droplet discharging device which is used in manufacturing an electronic board.

A droplet discharging device 1 of FIG. 1 basically is an ink jet device. More specifically, the droplet discharging device 1 includes tanks 101 for storing liquid materials 111, tubes 110, a ground stage GS, a discharging head unit (droplet discharging head) 103, a stage 106, a first positioning device 104, a second positioning device 108, a controlling unit 112, a light irradiation device 140, and supporting units 104a.

The discharging head unit 103 has a head 114 (see FIG. 2). This head 114 discharges droplets of the liquid materials 111 in response to signals from the control unit 112. The head 114 of the discharging head unit 103 is connected to the tanks 101 through the tubes 110, and therefore the liquid materials 111 are supplied to the head 114 from the tanks 101.

The stage 106 provides a flat surface for securing a substrate (will be described later). The stage 106 also serves to secure a position of the substrate using its suction power.

The first positioning device 104 is secured at a position of a predetermined height from the ground stage GS by the supporting units 104a. This first positioning device 104 serves to move the discharging head unit 103 in an X-axis direction and in a Z-axis direction orthogonal to the X-axis direction in response to the signals from the controlling unit 112. The first positioning device 104 further serves to rotate the discharging head unit 103 around an axis parallel to the Z-axis. In this embodiment, the Z-axis direction is a direction parallel to a vertical direction (namely, in a direction of a gravity acceleration).

The second positioning device 108 has the stage 106 move on the ground stage GS in a Y-axis direction in response to the signals from the controlling unit 112. The Y-axis direction is a direction orthogonal to both of the X-axis direction and the Z-axis direction.

As stated above, the first positioning device 104 has the discharging head unit 103 move in the X-axis direction. The second positioning device 108 has a substrate move in the Y-axis direction together with the stage 106. As a result thereof, a position of the head 114 changes relative to the substrate. More specifically, with the above described movements, the discharging head unit 103, the head 114, or nozzles 118 (see FIG. 2) move relative to the substrate in the X-axis direction and the Y-axis direction while they keep a predetermined distance from the substrate in the Z-axis direction. In other words, they scan relative to one another. The "relative movement" and the "relative scan" mean that at least one of a side where the liquid materials 111 are discharged and a side where the discharged liquid materials land (a receiving unit) is moved relative to the other side.

The controlling unit 112 has such a structure that the controlling unit can receive from an external information processor a discharge data indicating a relative position where the droplets of the liquid materials 111 are to be discharged. The controlling unit 112 stores thus received discharge data in its memory device as well as controls the first positioning device 104, the second positioning device 108, and the head 114 in accordance with thus stored discharge data. The discharge data is a data for applying the liquid materials 111 to the substrate in accordance with a predetermined pattern. In this embodiment, the discharge data is formed into a bit map data.

The liquid discharging device 1 having the above stated structure has the nozzles 118 of the head 114 (see FIG. 2) move relative to the substrate in accordance with the discharge data as well as discharges the liquid materials 111 from the nozzles 118 toward the receiving unit. There is a case where the relative movement of the head 114 and the discharge of the liquid materials 111 from the head 114 by the droplet discharging device 1 are collectively referred to as an "application scan" or a "discharge scan".

The light irradiation device 140 is a device for irradiating ultraviolet radiation onto the liquid materials 111 having been applied to the substrate. ON/OFF of the irradiation of the ultraviolet radiation by the light irradiation device 140 is controlled by the controlling unit 112.

Figure 2A:
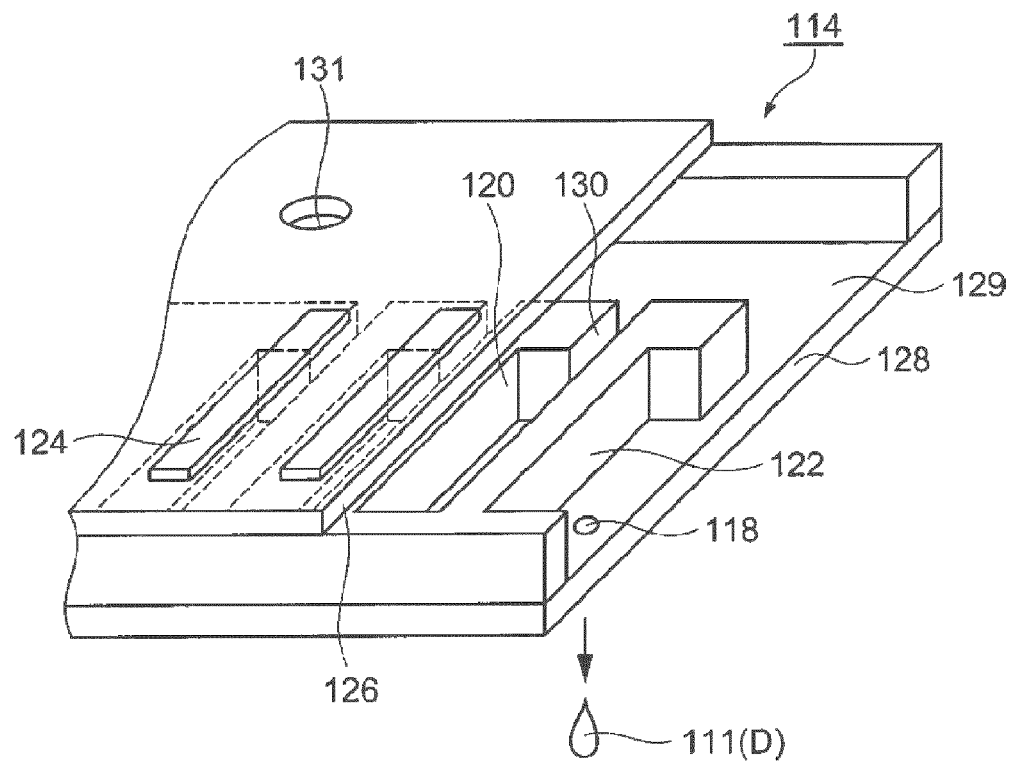
FIGS. 2A and 2B are schematic diagrams of a head of the droplet discharging device respectively.
Figure 2B:
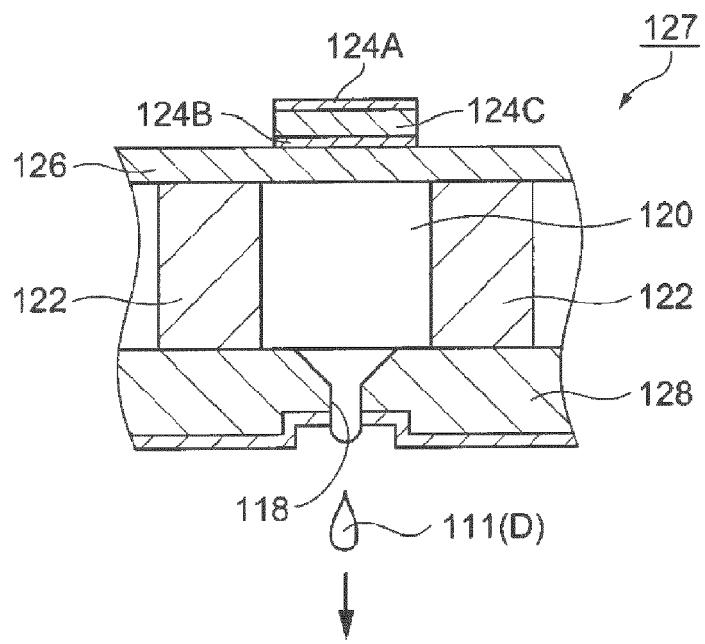

As shown in FIGS. 2A and 2B, the head 114 of the droplet discharging device 1 is an ink jet head having the plurality of nozzles 118. More specifically, the head 114 includes a vibrating plate 126, the plurality of nozzles 118, a nozzle plate 128 which defines an opening of each of the plurality of nozzles 118, a liquid bank 129, a plurality of partitions 122, a plurality of cavities 120, and a plurality of oscillators 124.

The liquid bank 129 is positioned between the vibrating plate 126 and the nozzle plate 128, and is always filled with the liquid materials 111 supplied from the not shown external tanks through a hole 131. The plurality of partitions 122 are positioned between the vibrating plate 126 and the nozzle plate 128.

Each of the cavities 120 is formed so as to be enclosed by the vibrating plate 126, the nozzle plate 128, and a pair of partitions 122. The cavities 120 are provided corresponding to the nozzles 118, such that the number of the cavities are equal to the number of the nozzles 118. The cavities 120 are supplied with the liquid materials 111 from the liquid bank 129 through supply ports 130 positioned between pairs of partitions 122. In the embodiment, each of the nozzles 118 has a diameter of, for example, about 27 μm.

Each of the plurality of oscillators 124 is positioned on the vibrating palate 126 so as to correspond to each of the cavities 120. Each of the plurality of oscillators 124 includes a piezo element 124C and a pair of electrodes 124A, 124B, the pair of electrodes sandwiching the piezo element 124C. The controlling unit 112 applies a driving voltage between the pair of electrodes 124A, 124B to thereby allowing the droplets D of the liquid materials 111 to be discharged from the corresponding nozzles 118. Volumes of the materials to be discharged from the nozzles 118 can be varied between equal to or more than 0 pl (pico-letter) and equal to or less than 42 pl. Shapes of the nozzles 118 are adjusted such that the droplets of the liquid materials 111 are discharged from the nozzles 118 in the Z-axis direction.

A discharging unit 127 may include a thermoelectric transducer instead of the piezo element. That is, the discharging unit 127 may have such a structure that the materials are discharged by using heat expansion of the materials caused by the thermoelectric transducer.

Multilayer Wiring Board

The multilayer wiring board manufactured according to the invention will now be described with reference to FIG. 3.

Figure 3:
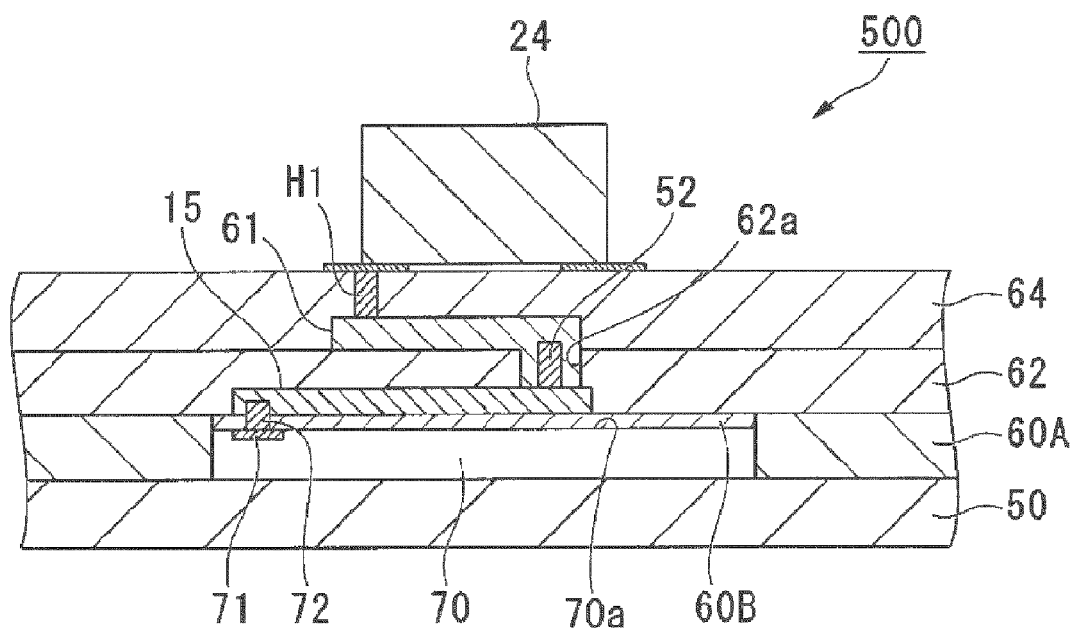
FIG. 3 includes cross sectional views, each illustrating a schematic structure of the multilayer wiring board.

The multilayer wiring board 500 shown in FIG. 3 includes pluralities of electronic components, conductive wirings, and insulation layers in a multilayered manner.

A detailed explanation will follow.

The multilayer wiring board 500 shown in FIG. 3 has such a structure that insulation layers 50, 60A, 60B, 62, 64 are layered one another, an IC chip (electronic component) 70 on the insulation layer (first insulation layer) 50 is embedded in the insulation layers 60A, 60B, and a chip part (electronic component) 24 is disposed on the insulation layer 64. Electrode pads (conductive parts) 71 are disposed in the adjacent to both of the end edges of the upper surface 70a of the IC chip 70 and are provided with bumps (conductive projections) 72 made of, for example, a silver material by means of the droplet discharging method.

On the surface 70a of the IC chip 70, there is provided the insulation layer (second insulation layer) 60B so as to allow bumps 72 to project therefrom. On the insulation layer 60B, there are provided wirings (conductive wirings) 15 to be connected to the bumps 72 at one ends of the wirings. On the other ends of the wirings 15 (positions where there is no bumps), there are provided conductive posts (second projections) 52 in a standing manner. Also, the insulation layer (third insulation layer) 60A is provided around the IC chip 70 so as to have a height generally equal to the insulation layer 60B.

On the insulation layers 60A, 60B, the insulation layer (fourth insulation layer) 62 inculing holes 62a for receiving the posts 52 therethrough is provided such that it covers the wirings 15. On this insulation layer 62, there is provided a wiring (second conductive wiring) 61 which is connected to the post 52 at one end thereof in order to be electrically connected to the electrode pad 71. On the insulation layer 62, there is provided the insulation layer 64 which covers the wiring 61. Then, there is provided on this insulation layer 64 a chip part 24 to be electrically connected to the wiring 61 (namely, to the electrode pad 71) through a through hole H1 made in the insulation layer 64.

Examples of the chip part 24 include a resistance, a condenser, an IC chip, an antenna element, and a crystal oscillator.

All of the insulation layers 50, 60A, 60B, 62, 64 are formed by applying an ink having an insulation property (insulation material) by means of the droplet discharging method using the above described droplet discharging device 1 to thereafter cure the ink having the insulation property. This ink having the insulation property includes an acrylic light-sensitive resin (more specifically, an acrylic resin having a light cure property or an epoxy resin having a thermosetting property) as a material having the light cure property which cures when it is applied with light energy or as a material having the thermosetting property which cures when it is applied with thermal energy. This material having the light cure property may include a solvent and a resin dissolved in the solvent. The material having the light cure property used in this case may include a photosensitive resin which can increase a degree of polymerization of itself, or may include a resin and a photopolymerization initiator which initiates cure of the resin. Or, the material may include as the material having the light cure property a photo-polymerized monomer for producing an insoluble insulation resin and a photo-polymerization initiator which initiates the photo-polymerization of the monomer. However, the material having the light cure property in this case may not include the photo-polymerization initiator if the monomer itself has a photofunctional group.

The wirings 15, 61, the posts 52, the bumps 72, and the through hole H1 are formed by discharging the conductive ink by means of the droplet discharging method using the droplet discharging device 1. The conductive ink to be used in the embodiment includes fine silver particles (will be described later).

Manufacturing Method of the Multilayer Wiring Board

The manufacturing method of the multilayer wiring board (electronic board) 500 will be described below with reference to FIGS. 4 and 5.

Figure 4A:
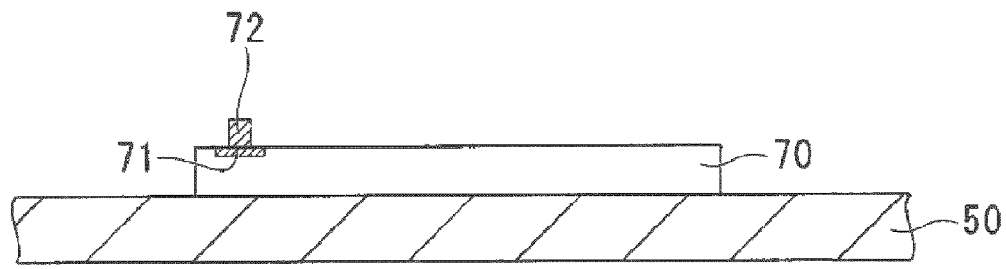
FIG. 4 shows processes of forming the multilayer wiring board.

As shown in FIG. 4A, the IC chip 70 including the bumps 72 provided on the electrode pads 71 is initially disposed on the insulation layer 50. In this case, the bumps 72 may be provided on the electrode pads 71 after the IC chip 70 is disposed on the insulation layer 50.

This insulation layer 50 is formed such that a predetermined amount of energy is applied by irradiating light having a light wave within the ultraviolet part for a predetermined time period subsequent to an application of the above stated ink having the insulation property, thereby placing it in a semicure condition in which only the acrylic resin cures while the epoxy resin is left uncured. At the time, an amount of energy to be applied to the ink having the insulation property is set to a value which is smaller than an amount of energy necessary for curing the ink having the insulation property.

The semicure condition of the ink having the insulation property means a condition of the material having the light cure property which is contained in the ink having the insulation property, in which the material is brought to a condition between a time the ink is discharged and a time the ink completely cures. In the embodiment, such an intervening condition is the above stated semicure condition. In the mean-time, the condition at the time the ink is discharged means such a condition that the material having the light cure property has viscosity of a grade capable of being discharged from the nozzles 118.

Accordingly, the insulation layer 50 of the semicure condition is formed as shown in FIG. 4A.

The bumps 72 are formed by discharging the conductive ink by means of the above stated droplet discharging method. A method of forming the bumps 72 is not limited to an ink jet method, but can be, for example, a stud bump method.

What is used as the conductive ink in the embodiment is a dispersion medium of a fine silver particle dispersion, in which fine silver particles, each having a diameter of about 10 nm, are dispersed in an organic solvent, is replaced with tetradecane, followed by dilution thereof and an adjustment thereof to have a density of 60 wt %, a viscosity of 8 mPa·s, and a surface tension of 0.022 N/m.

In other words, the conductive ink is discharged onto the electrode pads 71 of the IC chip 70 to burn them to finally obtain the bumps 72 as shown in FIG. 4A.

The dispersion medium can be anything as far as it can disperse therein the fine silver particles and is free from aggregation. Examples of the dispersion medium other than water include alcohol such as methanol, ethanol, propanol, and butanol; hydrocarbon system compound such as n-heputane, n-octane, decane, dodecane, tetradecane, toluene, xylene, cymene, durene, indene, dipentene, tetrahydronaphthalene, decahydronaphthalene, and cyclohexylbenzol; ether system compound such as ethylene glycol dimethyl ether, ethylene glycol diethyl ether, ethylene glycol methyl ethyl ether, diethylene glycol dimethyl ether, diethylene glycol diethyle ether, diethylene glycol methyl ethyl ether, 1,2-dimethoxyethane, bis (2-methoxyethyl) ether, and p-dioxane; and polar compound such as propylene carbonate, γ-buthyrolactone, N-methyl-2-pyrolidone, dimethyl formamide, dimethyl sulfoxide, and cyclohexanone. Among those, water, alcohol, hydrocarbon system compound, and ether system compound are preferred in consideration of a dispersibility of fine particles, a stability of dispersion liquid, and an easy application to the droplet discharging method (ink jet method), and water and hydrocarbon system compound are more preferred as the dispersion medium. Preferably, the viscosity of the dispersion liquid is, for example, between equal to or greater than 1 mPa·s and equal to or less than 50 mPa·s. This is because when the liquid materials are discharged in the form of droplets by means of the ink jet method, areas around the nozzles tend to be contaminated with ease due to a flow out of the ink if the viscosity is smaller than 1 mPa·s, whereas clogging of the nozzles occurs frequently if the viscosity is larger than 50 mPa·s to finally cause a difficulty in a smooth discharge of the droplets.

In order to adjust the surface tension, the dispersion liquid may be added with a small amount of a fluorine system, silicon system, or nonionic system surface tension adjustment agent as far as such adjustment agent would not remarkably degrade a contact angle to the substrate. The nonionic system surface tension adjustment agent serves to enhance a wettability of liquid to the substrate, to improve a leveling ability of a film, and to prevent the film to have fine unevenness on its surface. The surface tension adjustment agent may include the organic compound such as alcohol, ether, ester, ketone, as required.

Figure 4B:
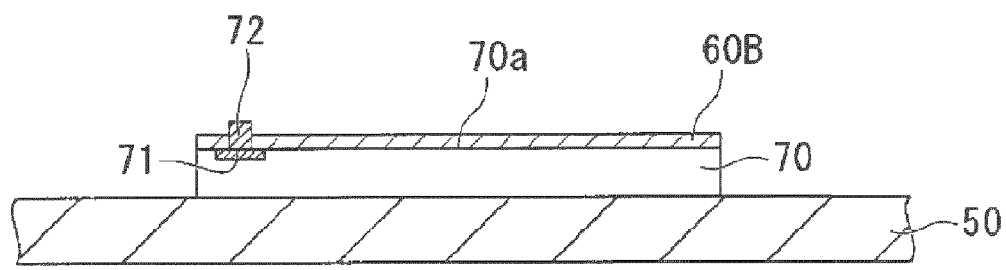

Then, as shown in FIG. 4B, the above stated ink having the insulation property is applied onto the upper surface 70a of the IC chip 70, and thereafter light having a wave length within the ultraviolet part is irradiated thereto for a predetermined time period in order to apply a predetermined amount of energy, thereby placing it in a semicure condition in which only the acrylic resin cures while the epoxy resin is left uncured. Accordingly, as shown in FIG. 4B, the insulation layer 60B of the semicure condition is formed. At the time, the insulation layer 60B is formed such that the bumps 72 project to be exposed from the insulation layer 60B.

Figure 4C:
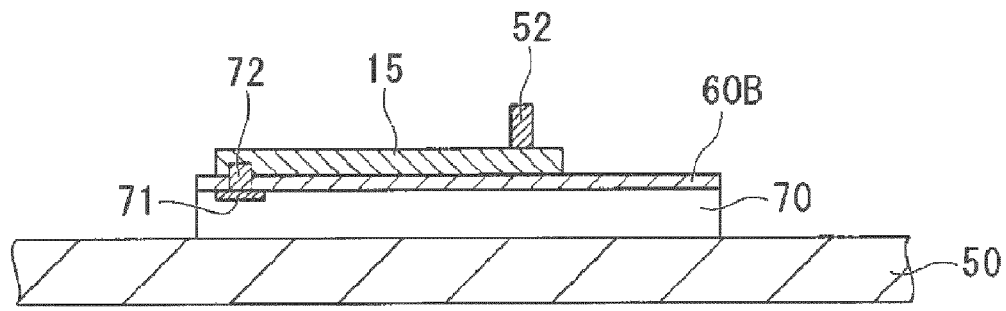

Subsequently, as shown in FIG. 4C, the conductive ink is discharged onto the insulation layer 60B by means of the above described droplet discharging method to thereby form the wirings 15 as well as the posts 52 are formed after the wirings 15 are dried. These posts 52 are formed at positions where there is no bumps 72, and therefore, the wirings 15 work as relocation wirings in order to establish conduction between the wirings 15 and the bumps 72 (electrode pads 71) at any optional positions.

Figure 4D:
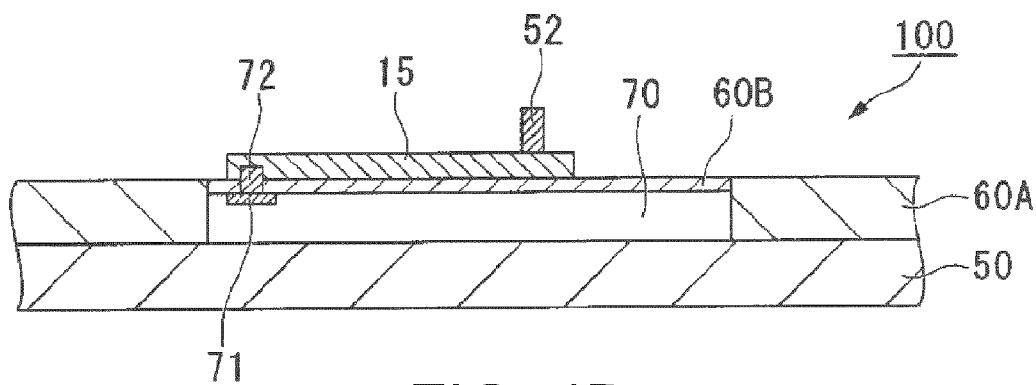

The ink having the insulation property is then applied around the IC chip 70 and thereafter light having a wave length within the ultraviolet part is irradiated thereon for a predetermined time period in order to apply a predetermined energy, thereby placing it in the semicure condition in which only the acrylic resin cures while the epoxy resin is left uncured. Accordingly, as shown in FIG. 4D, the insulation layer 60A of the semicure condition is formed. At the time, the insulation layer 60A is formed so as to have a height generally equal to the insulation layer 60B.

According to the above stated processes, the IC chip 70 is embedded in the insulation layers 60A, 60B and thereby a singly layered wiring board (electronic board) 100 having the wirings 15 which are connected to the electrode pads 71 through the bumps 72 is manufactured.

Figure 5A:
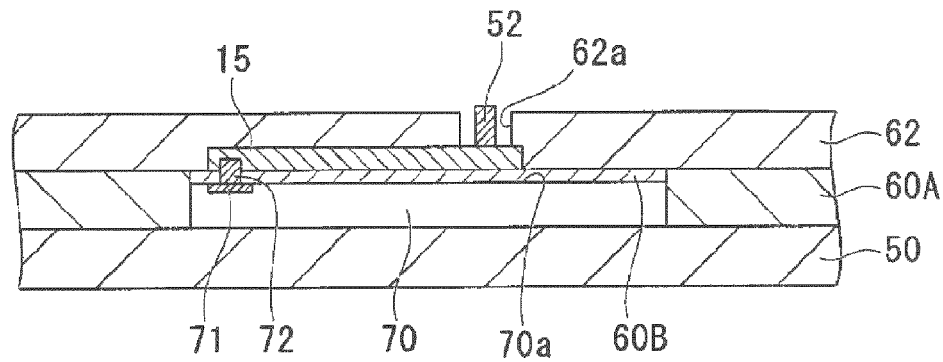
FIG. 5 shows processes of forming the multilayer wiring board.

On the insulation layers 60A, 60B, after the above stated ink having the insulation property is applied over the wirings 15, light having a wave length within the ultraviolet part is irradiated for a predetermined time period in order to apply a predetermined amount of energy, thereby placing it in a semicure condition in which only the acrylic resin cures while the epoxy resin is left uncured. Accordingly, as shown in FIG. 5A, the insulation layer 62 of the semicure condition is formed. At the time, the insulation layer 62 is patterned such that the holes 62a through which posts 52 pass are formed in the insulation layer 62.

Figure 5B:
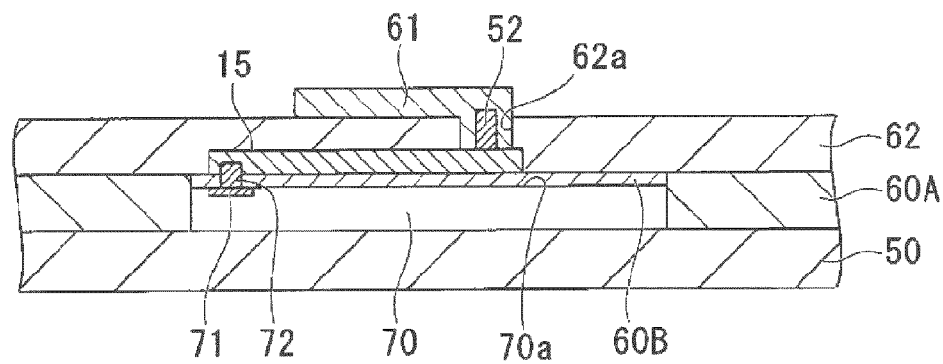

Then, as shown in FIG. 5B, the wiring 61 is formed by discharging the conductive ink onto the insulation layer 62 by means of the above described droplet discharging method. At the time, the conductive ink is also applied to the holes 62a in the insulation layer 62 to form the wiring 61 to be connected to the wirings 15.

Such a process may be acceptable that, without forming the posts 52 upon a formation of the wirings 15, the conductive ink is applied to the holes 62a upon a formation of the wiring 61 to form a through hole which establishes a connection between the wirings 15 and the wiring 61.

Figure 5C:
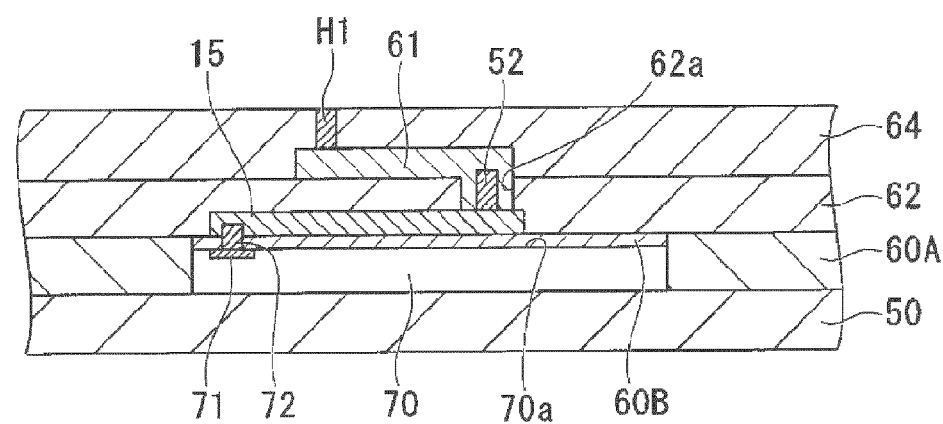

Subsequently, after the above described ink having the insulation property is applied to the insulation layer 62 so as to cover the wiring 61, light having a wave length within the ultraviolet part is irradiated for a predetermined time period in order to apply a predetermined amount of energy, thereby placing it in a semicure condition in which only the acrylic resin cures while the epoxy resin is left uncured. Accordingly, as shown in FIG. 5C, the insulation layer 64 of a semicure condition is formed.

The ink having the insulation property is applied so as to enclose the through hole H1 to form a hole corresponding to the through hole H1. Then, after the insulation layer 64 is placed in the semicure condition, the conductive ink is applied to the hole to finally form the through hole H1.

As shown in FIG. 3, the chip part 24 is mounted on the insulation layer 64 through the through hole H1.

After the above process, the insulation layers 50, 60A, 60B, 62, 64, the wirings 5, 61, and the through hole Hi are heated at one time to cure them. At the time, since the epoxy resin of the insulation layer having been left uncured cures, the insulation layer comes to be a completely cured condition together with the acrylic resin having been cured due to the light irradiation.

According to the above stated processes, the multilayer wiring board 500 can be formed.

As described above, since the wirings 15 to be connected to the bumps 72 are formed on the insulation layer 60B provided on the upper surface 70a of the IC chip 70 according to the embodiment, a stable conduction can be secured without causing disconnection even if the side surfaces of the IC chip 70 have a water-repellant property against the ink having the insulation property and therefore there is produced a space between the insulation layer 60A and the IC chip 70. In the embodiment, the insulation layer 60B is formed to have a thickness equal to a projecting height of the bumps 72 and the ink having the insulation property is applied while dodging the bumps 72 when the insulation layer 60B is formed, such that the bumps 72 can be exposed to thereby be able to avoid disconnection caused by the ink having the insulation property flowing over the electrode pads 71. In the embodiment, the IC chip 70 is embedded in the insulation layers 60A, 60B, such that a high density package can be realized.

According to the embodiment, where to establish an electrical connection between the wirings 15 and the electrode pads 71 can be determined at any positions depending on the wirings 15, such that a degree of freedom in design can be expanded.

Further, according to the embodiment, since the insulation layers 60B, 62 are provided so as to sandwich the wirings 15 therebetween and the insulation layers 62, 64 are provided so as to sandwich the wiring 61 therebetween, these insulation layers 60B, 62, 64 can be cured at one time by being heated. As such, it is possible that no stress will be left between the cured insulation layers 60B and 62, and between the cured insulation layers 62 and 64, respectively. Therefore, in the embodiment, such a multilayer wiring board 500 can be obtained that it hardly causes cracks and is stable in the structure.

Furthermore, according to the embodiment, it is possible to perform all the manufacturing processes of the wiring board 100 and the multilayer wiring board 500 using the droplet discharging method, and therefore a large development in productivity can be realized.

Still further, according to the embodiment, since the ink having the insulation property is applied by means of the droplet discharging method, it is easy to provide a patterning to a bonding material without using a mask, a resist, or the like, unlike a printing method, a photolithographic method, or the like methods. As such, no waste of the bonding material to be consumed occurs, which contributes to a cost reduction. Still further, according to the embodiment, since the ink having the insulation property is placed in the semicure condition by applying the light energy, it is easy to provide the ink the semicure process as well as it is possible to define an area where the ultraviolet radiation is to be irradiated with ease. As such, the area to be semicured can be patterned with ease.

Preferred embodiments according to the invention have been described above with reference to the accompanied drawings; however, it is to be noted that the invention is not limited to those embodiments. A shape of each component and a combination thereof as exemplified in the above embodiments are only for the sake of examples. They can be modified on the basis of the designing requirement or the like as far as such modifications will not depart from the spirit of the invention.

For example, arrangements of the wirings as illustrated in the above embodiments are mere examples, and therefore, the numbers of the wirings and the insulation layers, connection patterns with the electrode pads 71, and the others will be selectable as required.

The above described embodiments have such a structure that the insulation layers 50, 60A, 60B, 62, 64, the wirings 15, 61, and the through hole H1 are heated at one time to cure them. However, the invention is not limited to the above stated structure but can also have such a structure that they are heated at any time in the process to cure them.

What is claimed is:

1. A method of manufacturing an electronic board comprising:
    placing an electronic component including conductive parts on a first insulation layer with the conductive parts facing up and providing projections having conductivities, the projections being formed on an upper surface of the electronic component;
    applying an insulation material by means of a droplet discharging method providing a second insulation layer only on the upper surface of the electronic component while dodging the projections and an area of the first insulation layer on either side of the electronic component, the second insulation layer having a height such that the projections project out from the second insulation layer;
    providing conductive wirings on the second insulation layer so as to connect; and
    applying the insulation material on the area of the first insulation layer on either side of the electronic component by means of the droplet discharging method to provide a third insulation layer having a height generally equal to the second insulation layer.

2. The manufacturing method of the electronic board according to claim 1, wherein the conductive projections are formed by means of the droplet discharging method.

3. The manufacturing method of the electronic board according to claim 1, further comprising a process that second projections having conductivities are provided at positions of the conductive wiring where the former projections are absent.

4. The manufacturing method of the electronic board according to claim 3, wherein the conductive wirings and the second projections are formed by means of the droplet discharging method.

5. The manufacturing method of the electronic board according to claim 1, wherein the side surfaces of the electronic component have a water-repellant property against the insulation material.

6. A manufacturing method of a multilayer wiring board comprising,
    applying an insulation material by means of a droplet discharging method onto conductive wirings having been manufactured by the method of manufacturing the electronic board according to claim 1 to form a fourth insulation layer; and
    forming a second conductive wiring on the fourth insulation layer, the second conductive wiring being electrically connected to the conductive parts.

7. The manufacturing method of the multilayer wring board according to claim 6, wherein the second conductive wiring is formed by means of the droplet discharging method.

* * * * *